US010628619B2

(12) United States Patent
Shintani et al.

(10) Patent No.: US 10,628,619 B2
(45) Date of Patent: Apr. 21, 2020

(54) ANALYSIS MESH DATA GENERATING METHOD AND ANALYSIS MESH DATA GENERATING DEVICE

(71) Applicant: HITACHI, LTD., Tokyo (JP)

(72) Inventors: Masaki Shintani, Tokyo (JP); Makoto Onodera, Tokyo (JP); Chikara Kongou, Tokyo (JP); Yoshimitsu Hiro, Tokyo (JP)

(73) Assignee: HITACHI, LTD., Tokyo (JP)

( * ) Notice: Subject to any disclaimer, the term of this patent is extended or adjusted under 35 U.S.C. 154(b) by 920 days.

(21) Appl. No.: 14/652,252

(22) PCT Filed: Dec. 16, 2013

(86) PCT No.: PCT/JP2013/083547
§ 371 (c)(1),
(2) Date: Jun. 15, 2015

(87) PCT Pub. No.: WO2015/092842
PCT Pub. Date: Jun. 25, 2015

(65) Prior Publication Data
US 2016/0283616 A1   Sep. 29, 2016

(51) Int. Cl.
*G06F 7/48* (2006.01)
*G06F 30/20* (2020.01)
(Continued)

(52) U.S. Cl.
CPC .............. *G06F 30/20* (2020.01); *G06F 30/23* (2020.01); *G06T 17/205* (2013.01)

(58) Field of Classification Search
None
See application file for complete search history.

(56) References Cited

U.S. PATENT DOCUMENTS

| 5,838,594 | A | * | 11/1998 | Kojima | G06T 17/20 703/2 |
| 7,467,074 | B2 | | 12/2008 | Faruque et al. | |
| 7,646,384 | B2 | * | 1/2010 | Anderson | G06T 19/20 345/420 |
| 8,847,952 | B2 | * | 9/2014 | Takashima | G06T 17/20 345/420 |
| 9,607,423 | B2 | * | 3/2017 | Nakagawa | G06T 15/00 |

(Continued)

FOREIGN PATENT DOCUMENTS

| JP | 2007-122205 A | 5/2007 |
| JP | 2010-146224 A | 7/2010 |

(Continued)

OTHER PUBLICATIONS

Chinese Office Action dated May 15, 2017 in the Chinese Application No. 201380065502.6.

(Continued)

*Primary Examiner* — Rehana Perveen
*Assistant Examiner* — Nithya J. Moll
(74) *Attorney, Agent, or Firm* — Volpe and Koenig, P.C.

(57) ABSTRACT

The present invention enables easy generation of analysis mesh data from larger CAD data including complicated partial shapes without performing shape division of CAD data. An analysis mesh data generating device comprises: a storage device configured to store CAD data, model CAD data, and model mesh data associated with the model CAD data; and a control device. The control device searches for model CAD data similar to a partial shape in the CAD data from the model CAD data stored in the storage device, obtains model mesh data associated with the retrieved model CAD data from the storage device, calculates an application position of the model mesh data at analysis mesh data generated from the CAD data, deletes mesh data relate with the partial shape in the analysis mesh data, and combines the model mesh data at the calculated application position.

10 Claims, 11 Drawing Sheets

(51) Int. Cl.
*G06T 17/20* (2006.01)
*G06F 30/23* (2020.01)

(56) References Cited

U.S. PATENT DOCUMENTS

| | | |
|---|---|---|
| 2003/0058259 A1 | 3/2003 | Kawaguchi et al. |
| 2005/0197822 A1 | 9/2005 | Onodera et al. |
| 2008/0036765 A1* | 2/2008 | Hariya .................. G06T 17/20 345/423 |
| 2010/0156936 A1 | 6/2010 | Maeda et al. |
| 2011/0128284 A1 | 6/2011 | Takashima |

FOREIGN PATENT DOCUMENTS

| | | |
|---|---|---|
| JP | 2011-113530 A | 6/2011 |
| JP | 4966898 B2 | 7/2012 |

OTHER PUBLICATIONS

Bai et al. "Design Reuse Oriented Partial Retrieval of CAD Models", Computer Aided Design, Elsevier Pulishers BV., Barking, GB, vol. 42, No. 12, Jul. 18, 2010.

Smit et al. "Efficient Tetrahedral Remeshing of Feature Models for Finite Element Analysis", Engineering with Computers; An International Journal for Simulation-Based Engineering, Springer-Verlag, Lo, vol. 25, No. 4, Jun. 27, 2009.

Sheffer et al. "Efficient Adaptive Meshing of Parametric Models", Proceedings 6th. ACM Symposium on Solid Modeling and Applications. Ann Arbor, MI, Jun. 6-8, 2011New York, NY: ACM, US, 2001, pp. 59-70.

The Extended European Search Report dated Aug. 4, 2017 for the European Application No. 13898483.6.

* cited by examiner

ANALYSIS MESH DATA GENERATING METHOD AND ANALYSIS MESH DATA GENERATING DEVICE

TECHNICAL FIELD

The present invention relates to a technique to support generation of analysis mesh data from CAD data.

BACKGROUND ART

Numerical analysis using three-dimensional CAD data uses a method for modeling analysis object CAD data with mesh data comprising a polygon element and a polyhedron element. In particular, when an analysis object is a thin-plate structure, data is converted into a shell mesh comprising triangular elements and quadrilateral elements, and thereby a calculation cost on analysis is restrained. In relation to this technique, a technique is known that extracts each nodal point constituting part of tetrahedron mesh data, integrates nodal points at both ends of an element side into one nodal point at the center, and thereby generates mesh data (for example, see Patent Literature 1).

Mesh data desired by a device user is usually changed by an objective of analysis, however, and a method described in Patent Literature 1 requires modification of mesh data, and therefore has a problem of increased work-hour. As a solution to the problem, a technique is known that supports generation of analysis mesh data by using existing mesh data (for example, see Patent Literature 2). In particular, the technique compares analysis object CAD data with a shape of existing CAD data stored in a database, performs shape division into a similar shape portion and a non-similar shape portion, and generates analysis mesh data by combining mesh data generated for the non-similar shape portion, and existing mesh data applied to the similar shape portion.

CITATION LIST

PATENT LITERATURE 1: JP-B-4966898
PATENT LITERATURE 2: JP-A-2007-122205

SUMMARY OF INVENTION

Technical Problem

The technique for applying existing mesh data to generation of analysis mesh data as in Patent Literature 2 is an effective method for supporting generation of analysis mesh data from a viewpoint of shortening a creation time and securing quality. However, because the technique in Patent Literature 2 performs shape division of CAD data as an object, if the CAD data has a complicated shape including a boss or rib protruding on a curved surface, determining a boundary surface is difficult, which causes a problem of spending time for shape division.

An objective of the present invention is to enable easy generation of analysis mesh data from larger CAD data including complicated partial shapes without performing shape division of CAD data.

Solution to Problem

A typical example of the present invention is as follows. In short, the present invention is an analysis mesh data generating device that comprises: a storage device configured to store CAD data, model CAD data, and model mesh data associated with the model CAD data; and a control device, wherein the control device searches for model CAD data similar to a partial shape in the CAD data from the model CAD data stored in the storage device, obtains model mesh data associated with the retrieved model CAD data from the storage device, calculates an application position of the model mesh data at analysis mesh data generated from the CAD data, deletes mesh data relate with the partial shape in the analysis mesh data, and combines the model mesh data at the calculated application position.

Advantageous Effects of Invention

According to the present invention, in the analysis mesh data generating device for generating analysis mesh data by using existing mesh data, applying existing mesh data without performing shape division of the CAD data enables easy generation of the analysis mesh data from larger CAD data including complicated partial shapes. This enables shortening a generation time of the analysis mesh data.

DESCRIPTION OF EMBODIMENTS

A practical example of the present invention will now be explained using drawings.

Figure 1:
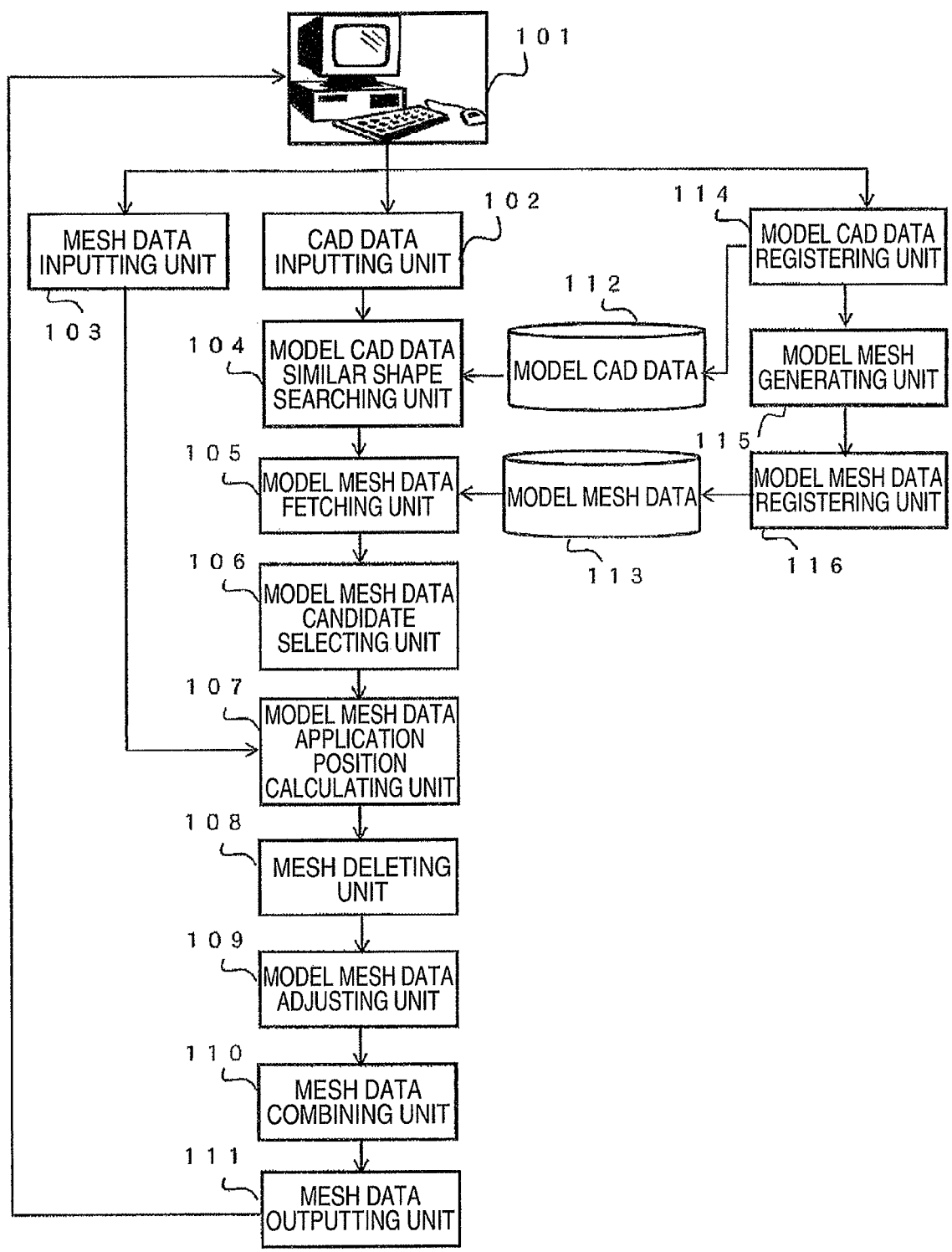
FIG. 1 is a diagram showing a system configuration of an analysis mesh data generating device.

FIG. 1 shows an embodiment related to a configuration of analysis mesh data generating device. The analysis mesh data generating device of the embodiment can be embodied by a general computer, and comprises an inputting/outputting device 101, an unshown control device such as a CPU (Central Processing Unit), and a storage device such as an HDD (Hard Disk Drive). The storage device has stored therein: programs, such as a CAD data inputting unit 102, a mesh data inputting unit 103, a model CAD data similar shape searching unit 104, a model mesh data fetching unit 105, a model mesh data candidate selecting unit 106, a model mesh data application position calculating unit 107, a mesh deleting unit 108, a model mesh data adjusting unit 109, a mesh data combining unit 110, a mesh data outputting unit 111, a model CAD data registering unit 114, a model mesh generating unit 115, and a model mesh data registering unit 116; model CAD data 112; and model mesh data 113. The control device loads the programs into a memory and executes them. In addition, the storage device has stored therein CAD data and analysis mesh data generated from the CAD data although those data are not shown. In addition, the storage device may be an external type.

The inputting/outputting device 101 is for outputting a GUI of the device and for inputting data, and comprises a keyboard, a pointing device, a display, and the like.

The CAD data inputting unit 102 is for inputting analysis object CAD data into the device. An example of the CAD data inputting unit 102 will be described below using FIGS. 2 and 3.

The mesh data inputting unit 103 is for inputting analysis mesh data into the device. An example of the mesh data inputting unit 103 will be described below using FIG. 4.

The model CAD data similar shape searching unit 104 is for searching for model CAD data similar to a partial shape in analysis object CAD data from the model CAD data 112. The model CAD data 112 includes multiple pieces of model CAD data registered by a device user. The model CAD data similar shape searching unit 104 compares these pieces of model CAD data with the analysis object CAD data, and searches for model CAD data having a shape similar to the partial shape in the analysis object CAD data from the model CAD data. An example of the model CAD data similar shape searching unit 104 will be described below using FIG. 5.

In order to search for a similar shape, for example, a method like a technique described in U.S. Pat. No. 8,345, 042 B2 is used that calculates the degree of similarity from difference between the quantity of characteristics of a partial shape of analysis object CAD data and the quantity of characteristics of a shape of model CAD data, and determines a shape having a small difference between the quantities of characteristics is similar. The similarity search leads the device to obtain model CAD data candidates having a shape with high similarity to the partial shape in the CAD data from the model CAD data 112. An example of obtaining model CAD data candidates will be described below using FIG. 6.

The model mesh data fetching unit 105 is for obtaining model mesh data associated with the model CAD data candidates from the model mesh data 113. The model mesh data 113 includes multiple pieces of model mesh data registered by the device user. These pieces of model mesh data have been generated from the respective pieces of model CAD data registered with the model CAD data 112, and are registered in association with generation source model CAD data. Association of generation relation between model mesh data and model CAD data will be described below using FIG. 7.

The model mesh data candidate selecting unit 106 is for selecting model mesh data to be applied to the analysis mesh data from the model mesh data obtained by the model mesh data fetching unit 105. The model mesh data candidate selecting unit 106 displays candidates of the model CAD data and the model mesh data on a model candidate selection screen, and the device user selects model mesh data to be applied to the analysis mesh data from these candidates. An example of the model mesh data candidate selection screen will be described below using FIG. 8.

The model mesh data application position calculating unit 107 is for calculating an application position of the model mesh data selected by model mesh data candidate selecting unit 106 at the analysis mesh data. The model mesh data application position calculating unit 107 checks a shape of the analysis mesh data input by the mesh data inputting unit 103 with the CAD data input by the CAD data inputting unit 102, and extracts a nodal point existing inside a partial shape to which the model mesh data is applied. Next, the model mesh data application position calculating unit 107 calculates coordinates of a nodal point existing at a joint position of the partial shape. An example of a method for calculating an application position of the model mesh data will be described below using FIG. 9.

The mesh deleting unit 108 is for deleting a partial mesh including the nodal point extracted by the model mesh data application position calculating unit 107. An example of a method for deleting a mesh is described below using FIG. 10.

The model mesh adjusting unit 109 is for performing a translation in the model mesh data, such as change of a mesh size, addition or deletion of a mesh, or transfer of a nodal point, according to the model CAD data and the partial shape of the CAD data. An example of changing the model mesh data will be described below using FIG. 11.

The mesh data combining unit 110 is for combining the analysis mesh data and the model mesh data. The device user is able to designate a combining position of the model mesh data and the analysis mesh data. The mesh data combining unit 110 adjusts a mesh at the combining position designated by the device user so that the mesh will align with a joint nodal point of the model mesh data, and combines the mesh. An example of a method for designating a combining position will be described below using FIG. 12. In addition, an example of a method for performing mesh combination of the analysis mesh data and the model mesh data will be described below using FIG. 13.

The mesh data outputting unit 111 is for outputting a generation result of the analysis mesh data to which the model mesh data was applied to an outputting device. The mesh data outputting unit 111 displays the analysis object CAD data and the generation result of the analysis mesh data on a model search screen 201.

The model CAD data registering unit 114 is for newly registering model CAD data with the model CAD data 112.

The model mesh generating unit 115 is for generating a mesh from the model CAD data newly registered with the model CAD data 112.

The model mesh data registering unit 116 is for newly registering the mesh data generated by the model mesh generating unit 115 with the model mesh data 113.

Figure 2:
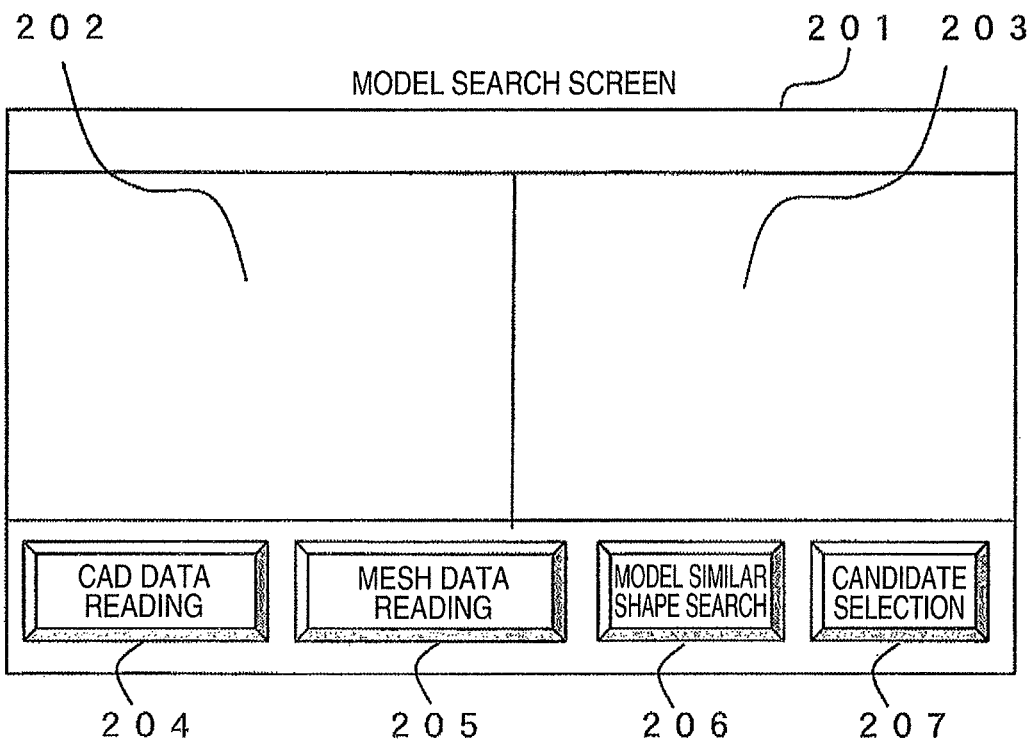
FIG. 2 is a diagram showing an example of a configuration diagram of a model search screen.

Next, FIG. 2 shows a screen configuration diagram of a model search screen of the analysis mesh data generating device in an embodiment of the present invention. The model search screen 201 comprises a CAD data display region 202, a mesh data display region 203, a CAD data reading button 204, a mesh data reading button 205, a model similar shape search button 206, and a candidate selection button 207.

Figure 3:
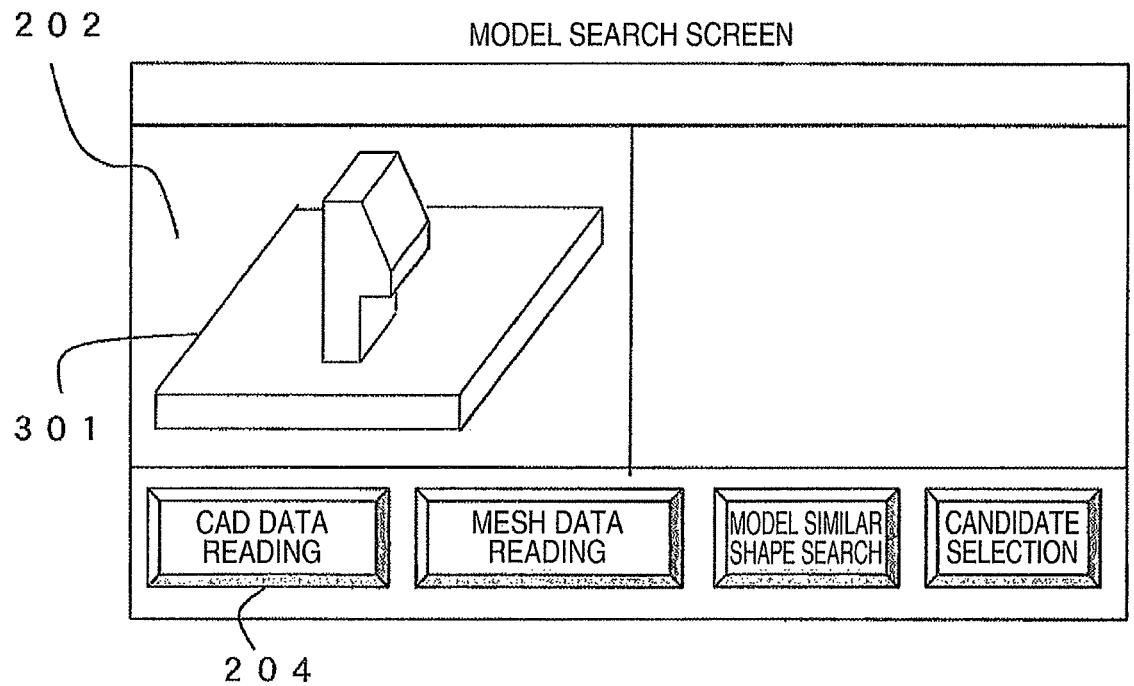
FIG. 3 is a diagram showing an example of having read in analysis object CAD data onto the model search screen.

Next, FIG. 3 shows an example of CAD data reading at the CAD data inputting unit 102 in an embodiment of the present invention. First, the device user depresses the CAD data reading button 204 and designates analysis object CAD data to be read into the device. FIG. 3 is an example of the device user designating CAD data 301. The CAD data 301 designated by the device user is displayed in the CAD data display region 202.

Figure 4:
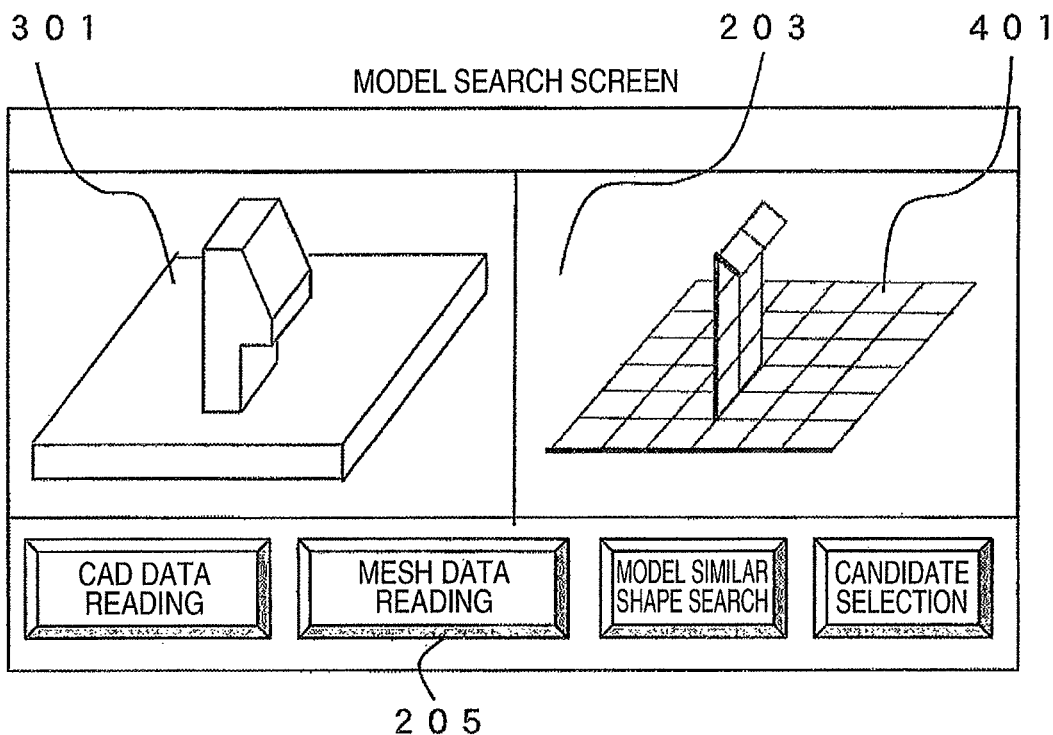
FIG. 4 is a diagram showing an example of having read in analysis mesh data onto the model search screen.

Next, FIG. 4 shows an example of reading in mesh data at the mesh data inputting unit 103 in an embodiment of the present invention. First, the device user depresses the mesh data reading button 205 and designates analysis mesh data to be read into the device. FIG. 4 is an example of the device user designating mesh data 401. The mesh data 401 designated by the device user is displayed in the mesh data display region 203. The analysis mesh data 401 has been generated from the analysis object CAD data 301 by using a mesh generating technique as described in JP No. 4966898.

Figure 5:
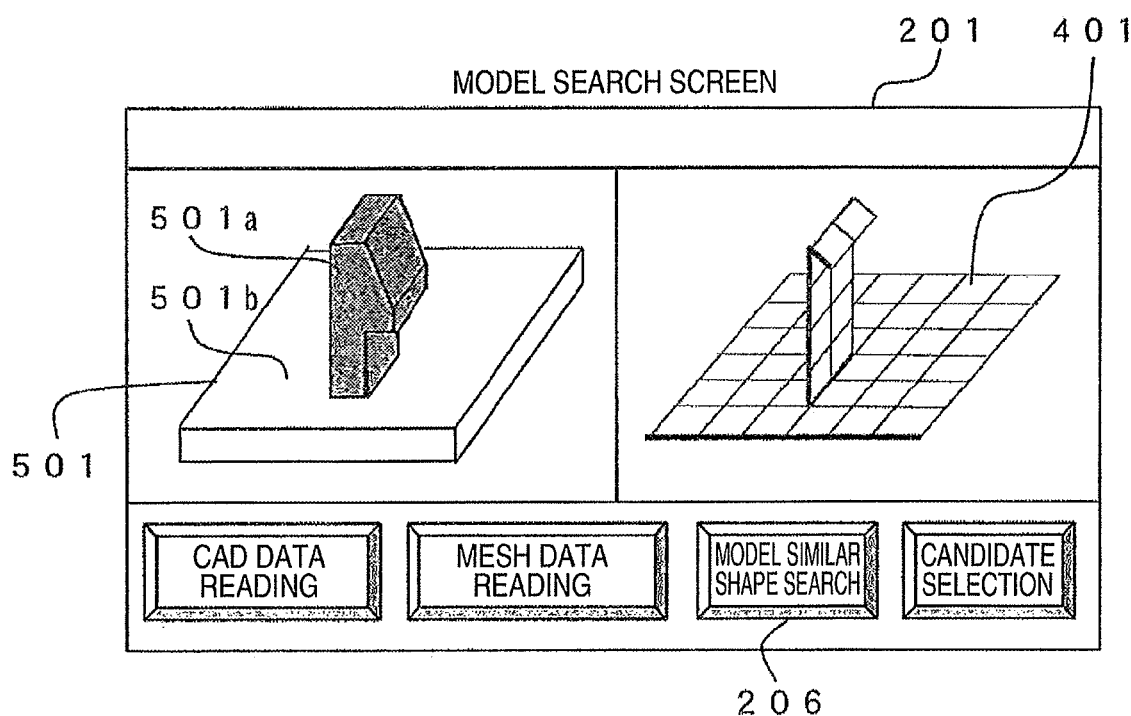
FIG. 5 is a diagram showing an example of a search screen for presenting a similar shape portion to model CAD data with respect to analysis CAD data.

Next, FIG. 5 shows an example of display of a similar shape at the model CAD data similar shape searching unit 104 in an embodiment of the present invention. First, the device user depresses the model similar shape search button 206, which starts the device searching for model CAD data similar to a partial shape in the analysis object CAD data from the model CAD data. FIG. 5 is an example of searching for a similar shape to a partial shape 501a of CAD data 501 as an object. The retrieved result is allowed to be output to the outputting device.

In similar shape search, it is also possible for the device user to select a partial shape to which model mesh data will be applied. In this case, the device user designates the partial shape 501a of the CAD data 501 on the model search screen 201.

Figure 6:
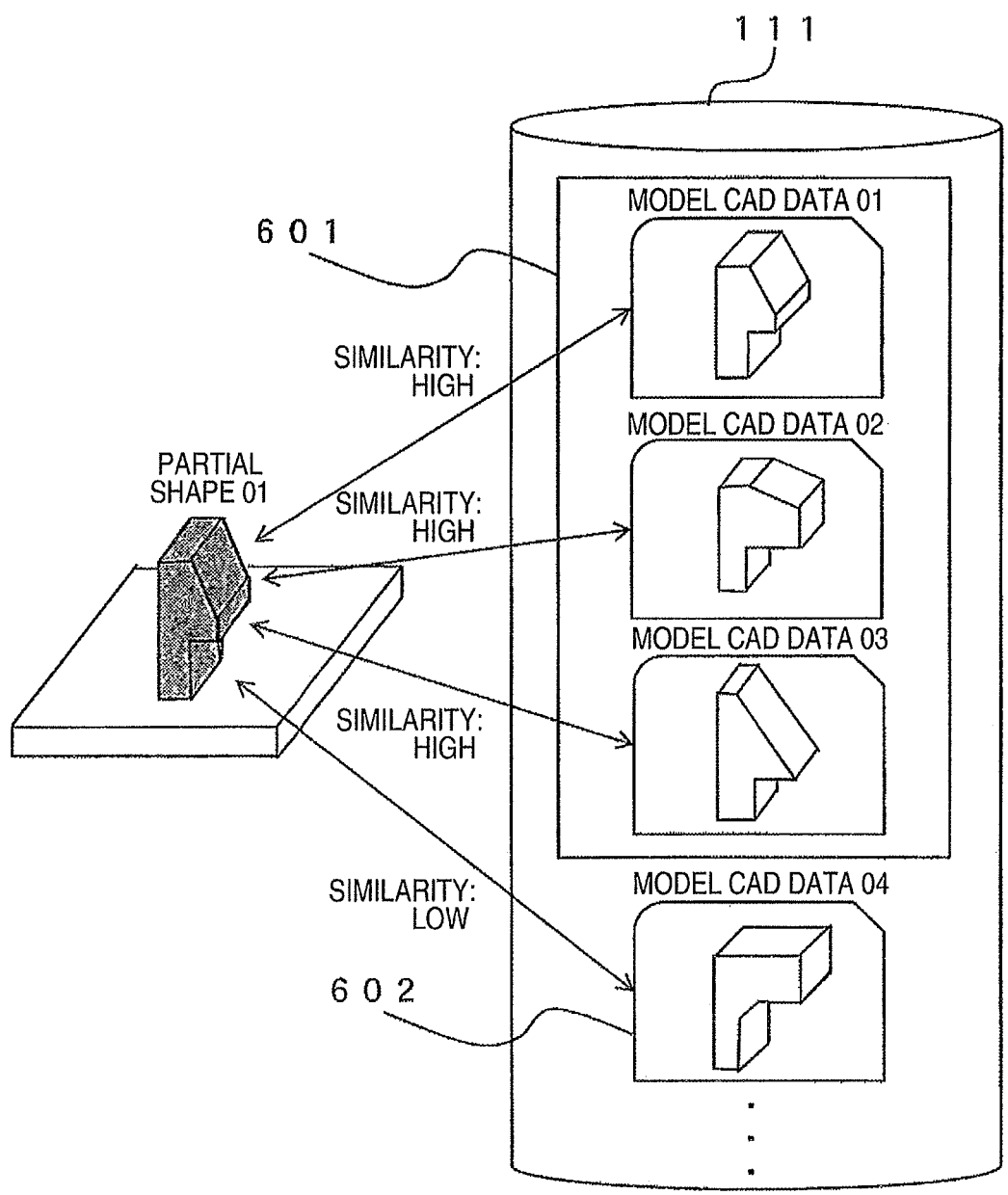
FIG. 6 is a diagram showing an example of searching for a partial shape similar to model CAD data from CAD data.

Next, FIG. 6 shows an example of similar shape search at the model CAD data similar shape searching unit 104 in an embodiment of the present invention. In the similar shape search, the degree of similarity between model CAD data and a partial shape is calculated using a technique like JP-A-2007-280129. FIG. 6 is an example of calculating the degree of similarity between model CAD data 01-04 registered with the model CAD data 112 and a partial shape 01. This calculation of the degree of similarity leads the device to divide the model CAD data into high-similarity model CAD data 601 and low-similarity model CAD data 602.

Figure 7:
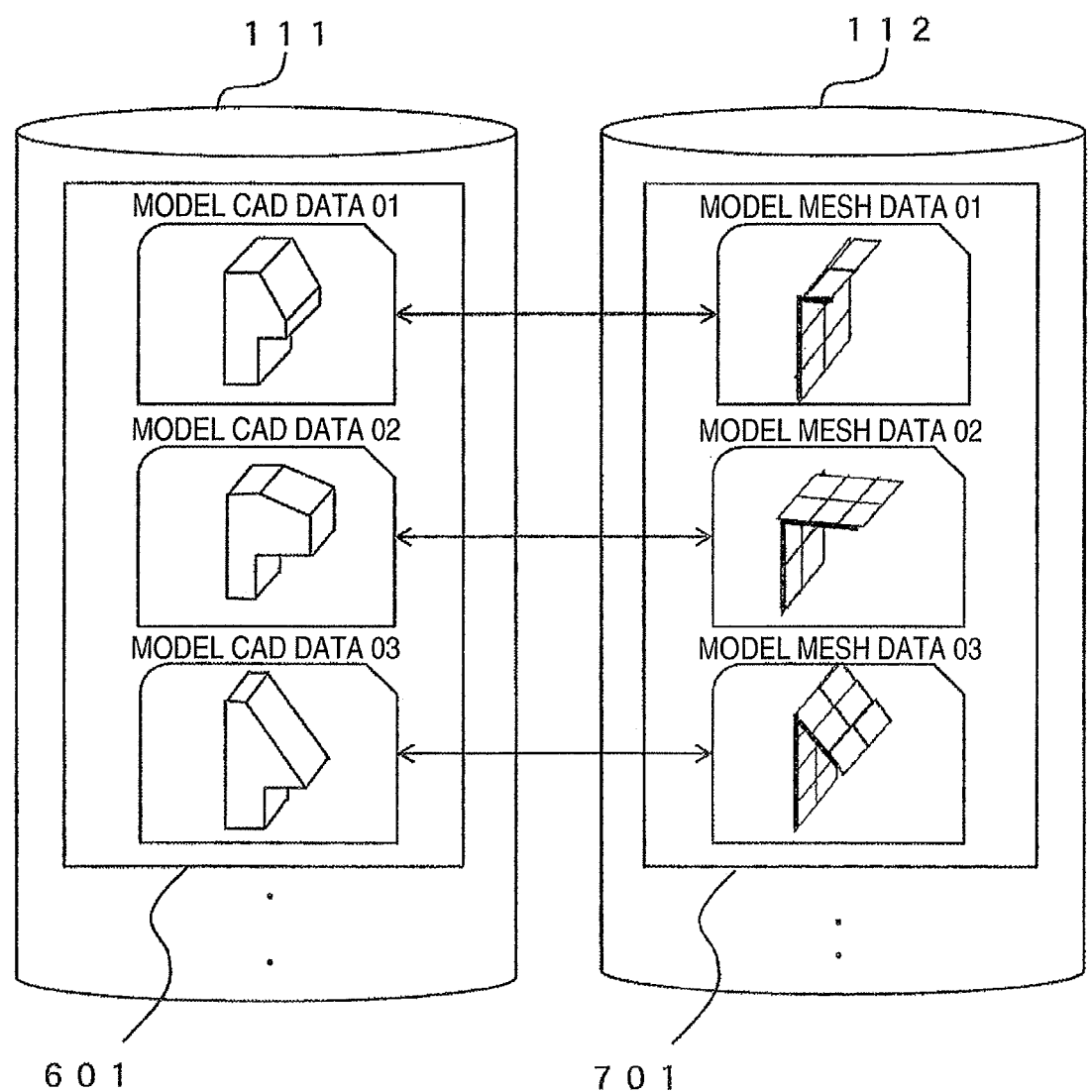
FIG. 7 is a diagram showing an example of relation between model CAD data and model mesh data.

Next, FIG. 7 shows an example of a method for obtaining model mesh data at the model mesh data fetching unit 105 in an embodiment of the present invention. The model mesh data fetching unit 105 obtains model mesh data 701 associated with the high-similarity model CAD data 601 searched for by the model CAD data similar shape searching unit 104 from the model mesh data 113. FIG. 7 is an example of obtaining model mesh data 01 associated with the model CAD data 01, model mesh data 02 associated with the model CAD data 02, and model mesh data 03 associated with the model CAD data 03 from the model mesh data 113.

Figure 8:
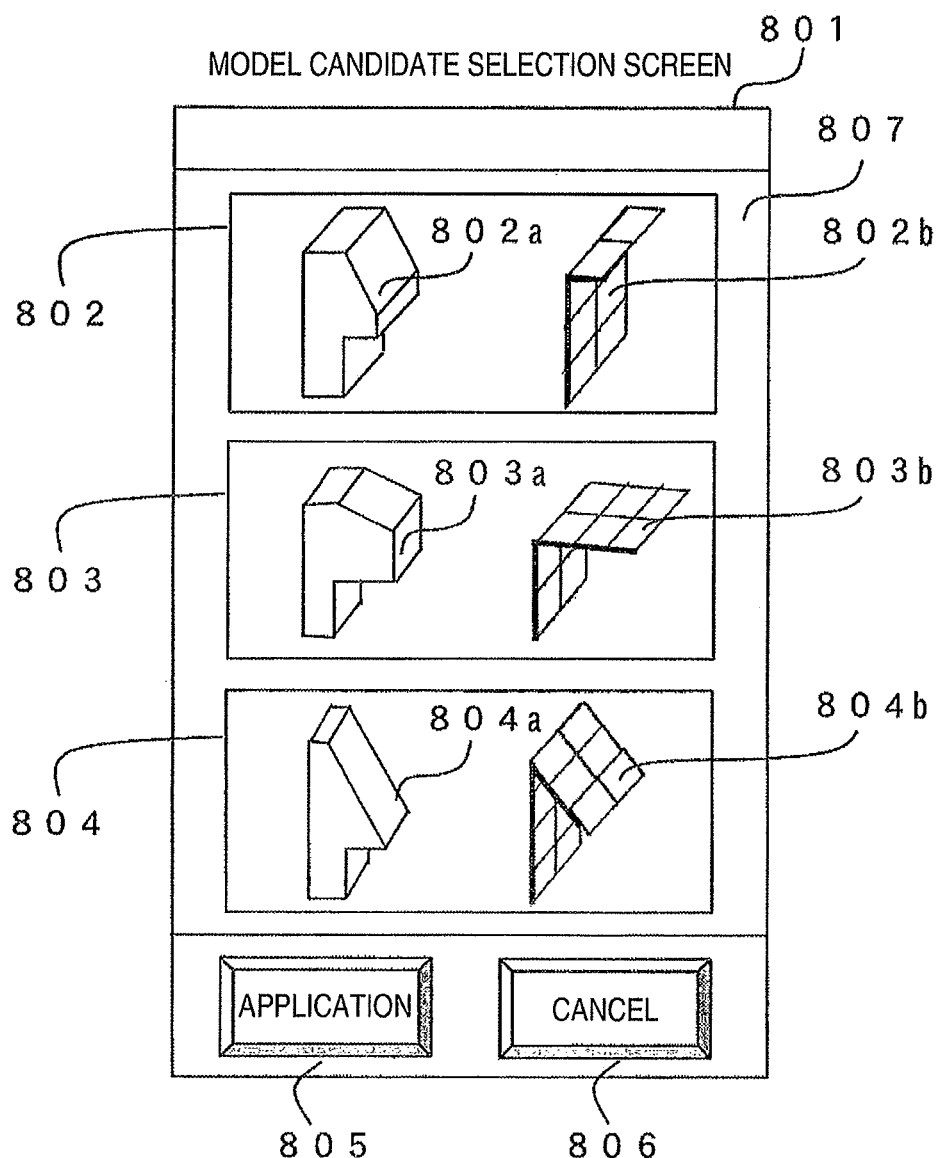
FIG. 8 is a diagram showing an example of a configuration diagram of a candidate selection screen presenting candidates of model CAD data and model mesh data.

Next, FIG. 8 shows a screen configuration diagram of a model candidate selection screen at the model mesh data candidate selecting unit 106 in an embodiment of the present invention. A model candidate selection screen 801 is a screen that opens when the candidate selection button 207 on the model search screen 201 is depressed, and comprises an application button 805, a cancel button 806, and a model display region 807.

The model candidate selection screen 801 shows a list of candidates for model CAD data and model mesh data applied to the partial shape in the CAD data. FIG. 8 is an example of displaying model mesh data 802b associated with model CAD data 802a as a first candidate 802. In the same way, FIG. 8 displays model mesh data 803b associated with model CAD data 803a as a second candidate 803, and displays model mesh data 804b associated with model CAD data 804a as a third candidate 804. The device user selects one piece of model mesh data to be applied to the analysis mesh data from the list of these candidates, and depresses the application button 805. The device user depresses the cancel button 806 if the device user cancels designation of the model mesh data.

Figure 9:
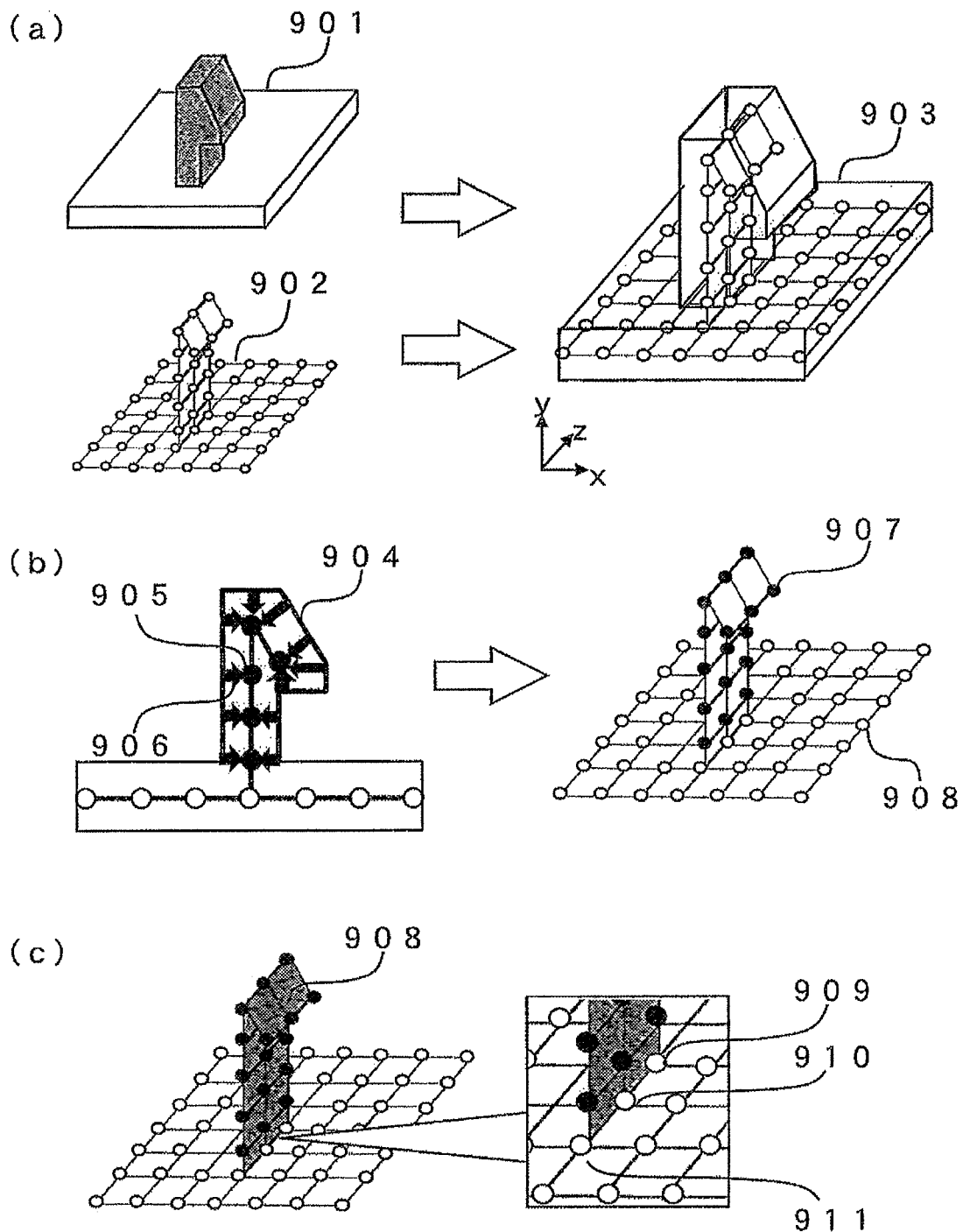
FIG. 9 is a diagram showing an example of extracting a position of mesh data corresponding to a partial shape.

Next, FIG. 9 shows a method for calculating a model mesh data application position at the model mesh data application position calculating unit 107 in an embodiment of the present invention. First, as shown in FIG. 9(a), the model mesh data application position calculating unit 107 checks shapes of analysis object CAD data 901 and analysis mesh data 902. As is explained in the embodiment in FIG. 4, the analysis mesh data 902 has been generated from the CAD data 901. Therefore, the shapes of both data can be checked, for example, by making coordinate reference points of the CAD data 901 and the analysis mesh data 902 align and comparing coordinates of points, lines, and faces constituting the CAD data 901 with coordinates of nodal points of the mesh data 902. A nodal point is a representative point used for expressing a mesh and holds a coordinate value from a reference point. For example, when a tetrahedron first-order element is expressed, a mesh can be expressed using four nodal points.

Next, the model mesh data application position calculating unit 107 extracts a nodal point existing inside a partial shape to which model mesh data is applied. In the extraction of the nodal point, the model mesh data application position calculating unit 107 determines that a nodal point whose distance from faces constituting the partial shape is equal to or less than a certain value exists inside the partial shape. FIG. 9(b) is an example of calculating distance from each face of a partial shape 904 to nodal points. The model mesh data application position calculating unit 107 calculates distance 906 between nodal points 905 and faces constituting the partial shape, and determines a nodal point whose distance is equal to or less than the certain value is situated inside the partial shape 904.

Next, the model mesh data application position calculating unit 107 extracts a mesh formed by nodal points existing inside the partial shape. FIG. 9(c) shows an example of having extracted a mesh composed of nodal points each of which has been determined to be situated inside the partial shape 904 in FIG. 9(b). Consequently, a partial mesh 908 is determined to be a mesh situated inside the partial shape 904.

Next, the model mesh data application position calculating unit 107 calculates a joint point of the partial mesh and the analysis mesh data. Nodal points 909, 910 and 911 in FIG. 9(c) are joint points of the partial mesh 908 and the analysis mesh data 902. Coordinates of these three nodal points are made into joint points for joining the model mesh data on the analysis mesh data.

Figure 10:
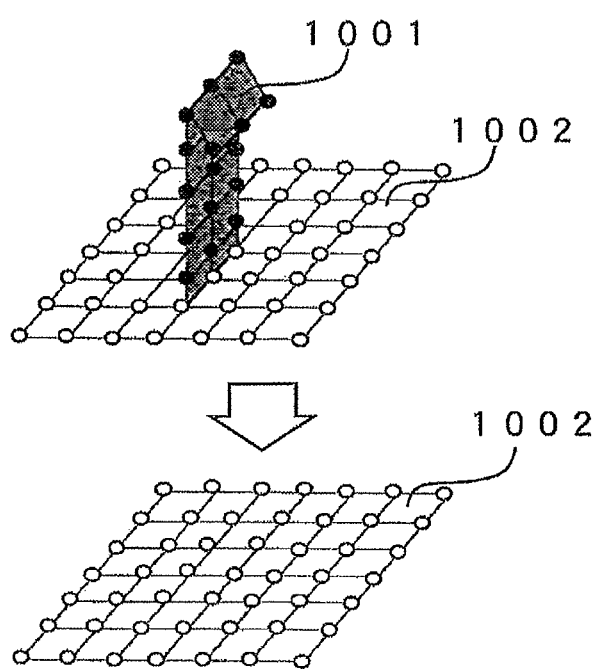
FIG. 10 is a diagram showing an example of deleting a mesh from analysis mesh data.

Next, FIG. 10 shows one example of a method for deleting a mesh at the mesh deleting unit 108 in an embodiment of the present invention. The mesh deleting unit 108 deletes all nodal points of existing mesh data 1001 recognized by the model mesh data application position calculating unit 107 from the analysis mesh data. The deletion of the mesh leads the analysis mesh data into a state in which only mesh data 1002 is left.

Figure 11:
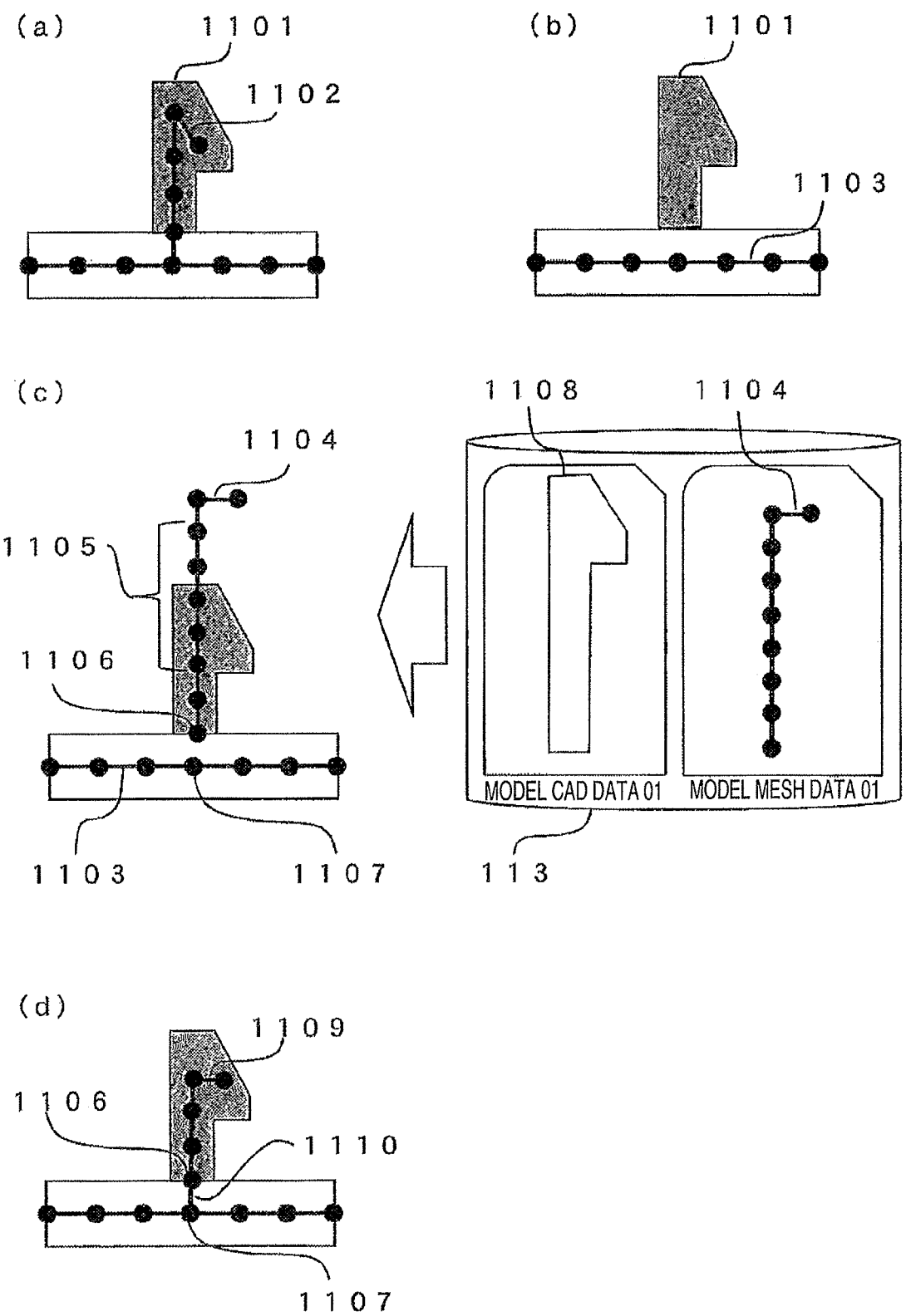
FIG. 11 is a diagram showing an example adjusting a mesh of model mesh data.

Next, FIG. 11 shows an example of model mesh data translation at the model mesh data adjusting unit 109 in an embodiment of the present invention. FIG. 11(a) shows a state of having read in analysis mesh data, and FIG. 11(b) shows a state of the mesh deleting unit 108 having deleted a partial mesh at a position of a partial shape. The deletion of the partial mesh makes partial mesh data 1102 corresponding to a partial shape 1101 deleted, and leads the analysis mesh data into a state of having left mesh data 1103 which is not a deletion object.

Next, FIG. 11(c) shows relation between CAD data and mesh data at a time of applying model mesh data. The model mesh data adjusting unit 109 obtains model mesh data 1104 from a database that holds models, and places it at the position of the partial shape 1101. In this case, as the model mesh data 1104, there only exists a partial mesh corresponding to model CAD data 1108, so there is not a mesh between a nodal point 1106 of the model mesh data 1104 and a nodal point 1107 of combining object mesh data 1103, and therefore they are not joined. In addition, a shape of the model CAD data 1108 is different from the partial shape 1101, and the model mesh data 1104 is in a state of protruding from the partial shape 1101.

Next, FIG. 11(d) shows an example of having translated the mesh of model mesh data. The mesh is made included inside the partial shape by deleting a partial mesh 1105 in FIG. 11(c). In addition, the nodal point 1106 of the model mesh data 1104 and the nodal point 1107 of the mesh data 1103 are combined by adding a mesh extension unit 1110 to the model mesh data 1104.

Figure 12:
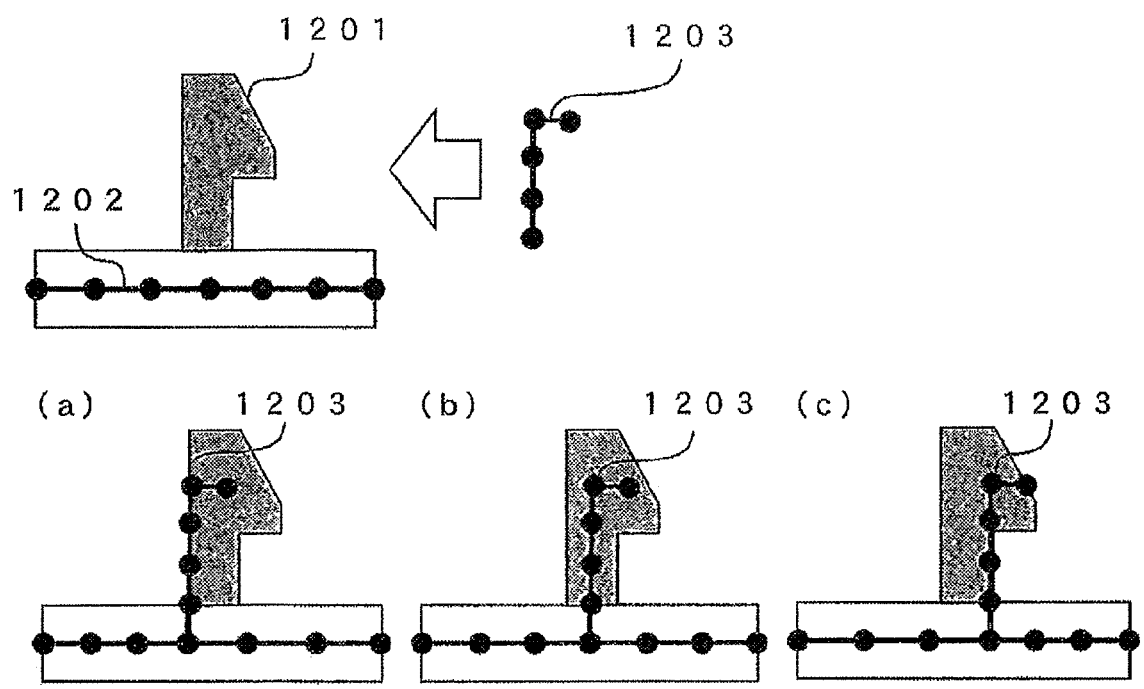
FIG. 12 is a diagram showing an example of adjusting a combining position of model mesh data.

Next, FIG. 12 shows an example of designating a combining position of model mesh data at the mesh combining unit 110 in an embodiment of the present invention. The device user designates a position to combine model mesh data 1203 on analysis mesh data 1202. FIG. 12(a) is an example of designating a left edge of a partial shape 1201. The model mesh data 1203 is placed at the left edge of the partial shape designated by the device user, and mesh adjustment of the combining point is performed. FIG. 12(b) is an example of placing the model mesh data 1203 at a position of the existing mesh deleted by the mesh deleting unit 108. In addition, FIG. 12(c) is an example of designating a right edge of the partial shape 1201, and the model mesh data 1203 is placed at the right edge of the partial shape 1201.

Figure 13:
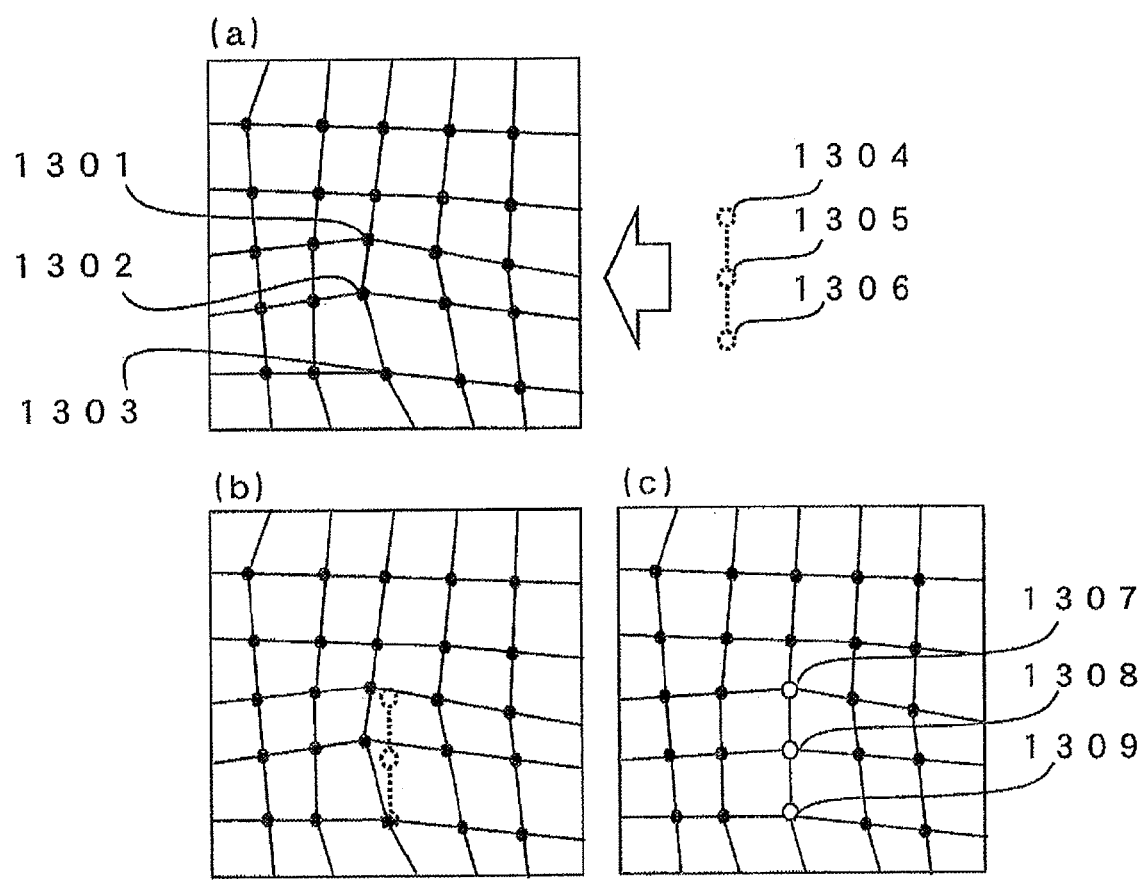
FIG. 13 is a diagram showing an example of combining analysis mesh data and model mesh data.

Next, FIG. 13 shows an example of a method for combining a mesh when model mesh data and analysis mesh data are configured by a shell mesh at the mesh combining unit 110 in an embodiment of the present invention. As shown in FIG. 13(a), nodal points 1304, 1305 and 1306 of model mesh data are joined with nodal points 1301, 1302 and 1303 on combining object mesh data.

First, the mesh combining unit 110 determines a combining position of the model mesh data on the basis of a calculation result by the model mesh data application position calculating unit 107. In an example of FIG. 13(b), the nodal points of the model mesh data are placed on a combining surface of the analysis mesh data.

Next, the mesh combining unit 110 adjusts a mesh of the combining surface so that the mesh aligns with the respective nodal points on the joint surface of the model mesh data. Consequently, the mesh combining unit 110 adjusts each nodal point of the combining object mesh data as in FIG. 13(c) and combines the mesh at a position of nodal points 1307, 1308 and 1309.

Thus, the practical example of the present invention is explained specifically, but the present invention is not limited to the above, and various modifications can be made within a range not departing from its spirit. For example, the above-described programs may be stored in the storage device in advance, or may be read out when needed via a data reading unit, which is not shown, by storing them in a portable storage medium available to a computer, or may be stored in the storage device by downloading them when needed from another device connected with a network, a communication medium available to a computer. In addition, the above-described programs may be embodied by hardware, for example, by designing part or all of them by an integrated circuit.

According to the above-described practical example, in the analysis mesh data generating device for generating analysis mesh data by using existing mesh data, applying the existing mesh data without performing shape division of CAD data enables easy generation of the analysis mesh data from larger CAD data including complicated partial shapes. This enables shortening a generation time of the analysis mesh data.

REFERENCE SIGNS LIST

101 Inputting/outputting device
102 CAD data inputting unit
103 Mesh data inputting unit
104 Model CAD data similar shape searching unit
105 Model mesh data fetching unit
106 Model mesh data candidate selecting unit
107 Model mesh data application position calculating unit
108 Mesh deleting unit
110 Mesh data combining unit
111 Mesh data outputting unit
112 Model CAD data
113 Model mesh data
114 Model CAD data registering unit
115 Model mesh generating unit
116 Model mesh data registering unit

The invention claimed is:

1. A system that reduces an amount of time required to generate a mesh data file, the system comprising:
    a memory that stores computer-aided design (CAD) data; and
    a processor communicatively coupled to the memory, wherein the processor:
    receives an input of a CAD model,
    forms model mesh data based on the CAD model,
    identifies a partial shape in the CAD model,
    searches the memory for model CAD data similar to the partial shape in the CAD data to locate a replacement shape,
    obtains, from the memory, replacement model mesh data associated with the replacement shape,
    calculates a corresponding position of the partial shape in the model mesh data,
    deletes mesh data of the partial shape from the model mesh data to form first mesh data,
    inserts the replacement model mesh data into the first mesh data at the corresponding position,
    translates the replacement model mesh data until a common nodal point exists between the replacement model mesh data and the first mesh data,
    deletes a portion of the replacement model mesh data to form second mesh data, wherein the portion of the portion of the replacement model mesh deleted is selected so that replacement model mesh data does not protrude from the partial shape after the replacement model mesh data is translated, and
    forms the mesh data file based on the second mesh data.

2. The system according to claim 1,
    wherein the mesh data file is displayed on a display.

3. The system according to claim 1,
    wherein the processor further:
    translates the mesh data file to form a new CAD model.

4. The system according to claim 3,
wherein the processor translates the mesh data file according to a shape of the model CAD data and the partial shape.

5. The system according to claim 1,
wherein the corresponding position is designated via an inputting device.

6. A method for reducing an amount of time required to generate a mesh data file, the method comprising:
receiving an input of a computer-aided design (CAD) model,
forming model mesh data based on the CAD model,
identifying a partial shape in the CAD model,
searching a memory for model CAD data similar to the partial shape in the CAD data to locate a replacement shape;
obtaining, from the memory, replacement model mesh data associated with the replacement shape;
calculating a corresponding position of the partial shape in the model mesh;
deleting mesh data of the partial shape from the model mesh data to form first mesh data;
inserting the replacement model mesh data into the first mesh data at the corresponding position; and
translating the replacement model mesh data until a common nodal point exists between the replacement mesh data and the first mesh data
deleting a portion of the replacement model mesh data to form second mesh data, wherein the portion of the portion of the replacement model mesh deleted is selected so that replacement model mesh data does not protrude from the partial shape after the replacement model mesh data is translated, and
forming the mesh data file based on the second mesh data.

7. The method according to claim 6, further comprising:
outputting the mesh data file to a display.

8. The method according to claim 6, further comprising:
translating the mesh data file to form a new CAD model.

9. The method according to claim 8, wherein the mesh data file is translated according to a shape of the model CAD data and the partial shape.

10. The method according to claim 6, wherein the corresponding position is designated via an inputting device.

* * * * *